United States Patent [19]
Tanabe et al.

[11] 4,263,087
[45] Apr. 21, 1981

[54] PROCESS FOR PRODUCING EPITAXIAL LAYERS

[75] Inventors: Kaoru Tanabe, Kawasaki; Yoshifumi Nomura, Ube; Mamoru Maeda; Mikio Takagi, both of Kawasaki, all of Japan

[73] Assignee: Fujitsu Limited, Tokyo, Japan

[21] Appl. No.: 120,094

[22] Filed: Feb. 11, 1980

[30] Foreign Application Priority Data

Feb. 19, 1979 [JP] Japan .................................. 54-18121

[51] Int. Cl.³ .......................................... C23C 13/00
[52] U.S. Cl. .............................. 156/613; 219/10.49 R; 427/45.1; 427/46; 427/82; 427/86
[58] Field of Search ..................... 427/45.1, 46, 82, 85; 219/10.41, 10.49 R; 156/613, 614; 148/175

[56] References Cited
U.S. PATENT DOCUMENTS

| | | | |
|---|---|---|---|
| 3,682,699 | 8/1972 | Koga et al. | 156/613 |
| 3,765,960 | 10/1973 | Boss et al. | 427/82 |
| 3,900,597 | 8/1975 | Chruma et al. | 427/82 |

Primary Examiner—John H. Newsome
Attorney, Agent, or Firm—Staas & Halsey

[57] ABSTRACT

Epitaxial layers are formed by introducing a reaction gas mixture into a reaction vessel in which semiconductor substrates are located, under a pressure of not higher than 1333 Pa (10 Torr), and heating said semiconductor substrates by high frequency induction power so that layers grow epitaxially on said semiconductor substrates. The frequency f of high frequency power is not higher than 50 kHz, and the pressure P in said reaction vessel is maintained in the following range $$1333 > P_{[Pa]} \geq 10^{\frac{2f-34.3}{21}}$$

$$\left(10 > P_{(Torr)} \geq 10^{\frac{2f-79}{21}}\right)$$

wherein, P is the pressure in units of Pa or Torr in the reaction vessel and f is the frequency in kHz of said high frequency power.

9 Claims, 3 Drawing Figures

PROCESS FOR PRODUCING EPITAXIAL LAYERS

FIELD OF THE INVENTION

1. Background of the Invention

The present invention relates to a process for producing epitaxial layers adapted for use in the production of semiconductor devices.

2. Description of the Prior Art

There are two known methods for heating monocrystalline semiconductor substrates, i.e., wafers, in epitaxial growth techniques, by direct radiant heating and induction heating. The direct radiant heating requires high intensity light radiation so as to obtain virtually slip-free and dislocation-free epitaxial wafers. Therefore, the induction heating method is more commonly used. However, it becomes increasingly difficult to deposit silicon having good properties by the induction heating method, as the wafer diameter and thickness increase.

The epitaxial growth technique under reduced pressure has lately been put to practical use, as described hereafter. Referring to FIG. 1, semiconductor substrates, e.g., silicon wafers 1, are supported on a carbon susceptor 2 which is located inside a quartz reaction tube 3. A mixture of a silicon source gas, such as dichlorosilane ($SiH_2Cl_2$), in an amount of about 0.5% by volume and a carrier gas, such as hydrogen ($H_2$), is introduced through an inlet 4 into the reaction tube 3, where the gas pressure is adjusted to a predetermined pressure. A high frequency (RF) power of 200~400 kHz is supplied to a work coil 5, surrounding the reaction tube 3, so that the susceptor 2 is heated by induction. Silicon wafers 1 are heated conductively by the hot susceptor 2. The source gas is decomposed on the surface of the silicon wafers 1 and silicon epitaxial layers grow on the surface of the silicon wafers 1. In the induction method, the silicon wafers are easily heated and their temperature can be easily regulated. The gas mixture within the reaction tube is exhausted by a vacuum pump. Thus, the pressure of the gas mixture is reduced to a predetermined value. When the pressure is low, the resulting epitaxial layer has a relatively uniform thickness along the direction of the gas flow, and, further, the autodoping of impurities into the epitaxial layers is decreased.

However, if the pressure is lower than 1333 Pa (10 Torr), the crystallographic property of the epitaxial layers becomes rather polycrystalline. That is because a glow discharge occurs which, firstly, excites hydrogen atoms to form hydrogen plasma which, in turn, etches the surface of monocrystalline silicon wafers, and the glow discharge, secondly, decomposes the silicon source even in the vapor phase so as to produce very finely divided polycrystalline silicon which, in turn, deposits on the etched surface of the wafers. Therefore, the silicon epitaxial layers become rather polycrystalline.

SUMMARY OF THE INVENTION

It is an object of the present invention to provide a process for producing epitaxial layers of excellent crystallographic properties.

It is another object of the present invention to provide a process for producing epitaxial layers of uniform thickness.

It is still another object of the present invention to provide a process for producing epitaxial layers having less autodoped impurities.

It is yet another object of the present invention to provide a process for producing epitaxial layers easily at a stable temperature.

Further objects and advantages of the present invention will become apparent from the following description of the present invention.

According to the present invention, there is provided a process for producing epitaxial layers comprising the steps of introducing a reaction gas mixture into a reaction vessel in which semiconductor substrates are located, in which the pressure in said reaction vessel is maintained at not higher than 1333 Pa (10 Torr), and heating said semiconductor substrates by high frequency induction power so that layers grow epitaxially on said semiconductor substrates, wherein the frequency f of high frequency power is maintained not higher than 50 kHz, and the pressure P in said reaction vessel is maintained in the following range:

$$1333 > P_{[Pa]} \geq 10^{\frac{2f-34.3}{21}}$$
$$\left(10\, P_{(Torr)} \geq 10^{\frac{2f-79}{21}}\right)$$

wherein, P is the pressure in respective units of Pa or Torr in the reaction vessel and f is the frequency in kHz of said high frequency power.

It is convenient to provide a process for producing epitaxial layers in which said substrates are made of silicon and said reaction gas mixture is a mixture of a silicon source gas and a carrier gas.

DETAILED EXPLANATION OF THE PREFERRED EMBODIMENTS

The present invention will be understood more readily with reference to the following description. Also, the present invention will be compared to the prior art.

The inventors found that, when the frequency f of the high frequency power is reduced, a stable reaction region I (FIG. 2) is broadened downward, i.e., the pressure P in the reaction vessel is lowered and that, when the frequency f is maintained not higher than 50 kHz, no glow discharge appears. Thus, no hydrogen plasma is produced which could etch the surface of the semiconductor substrates, i.e. wafers, and, therefore, epitaxial layers of uniform thickness having excellent crystallographical properties grow on the semiconductor wafers, e.g., silicon semiconductor substrates, even if the reaction pressure in the reaction vessel is reduced to lower than 1333 Pa (10 Torr).

Figure 2:
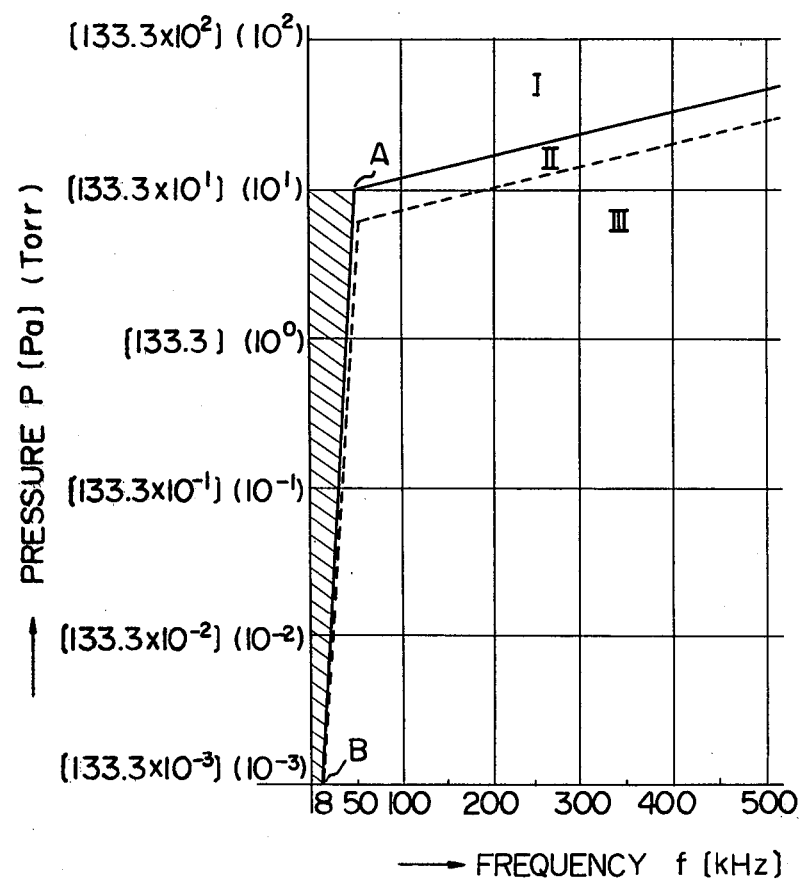
FIG. 2 illustrates curves showing the relationship between the frequency f of the high frequency power and the pressure P in the reaction vessel.

Referring to FIG. 2, the axis of the abscissa represents the frequency f [kHz] of the high frequency power and the axis of the ordinate represents the pressure P in respective units of Pa and Torr in the reaction vessel.

The frequencies commonly used in the prior art are about 200~400 kHz. The silicon epitaxial layers produced in region I exhibit stacking faults of less than about $10/cm^2$. In the reaction condition of region II, hydrogen plasma is not yet observed. However, the silicon epitaxial layers exhibit stacking faults of about $10 \sim 10^2/cm^2$. In the reaction condition of region III, glow discharge is observed and hydrogen plasma is detected using a spectrophotometer and the silicon epitaxial layers of region III exhibit stacking faults of about $10^2 \sim 10^4/cm^2$ and, sometimes become rather polycrystalline.

The linear line connecting points A (f=50 kHz, $p=133.3\times10^1$ Pa ($10^1$ Torr) and B(f=8 kHz, $P=133.3\times10^{-1}$ Pa-($10^{-3}$ Torr) in FIG. 2 is calculated as follows.

$$\log P_{[Pa]} = \frac{3.1139 - (-0.8752)}{50 - 8} f + k \quad (I)$$

$$\therefore \log P_{[Pa]} = \frac{3.989}{42} f + k$$

$$\left( \begin{array}{l} \log P_{(Torr)} = \frac{1-(-3)}{50-8} f + k \\ \therefore \log P_{(Torr)} = \frac{4}{42} f + k = \frac{2}{21} f + k \end{array} \right)$$

Then, the values of f and P at point B are substituted in the respective formulas (I) to obtain.

$$-0.8752 = \frac{3.989}{42} 8 + k$$

$$\therefore k = -1.635$$

$$\left( \begin{array}{l} -3 = \frac{2}{21} 8 + k \\ \therefore k = -\frac{79}{21} \end{array} \right)$$

Then, the value of k is substituted in the respective formulas (I) to derive $$\log P_{[Pa]} = \frac{3.99}{42} f - 1.635 \quad (II)$$

$$\therefore P_{[Pa]} = 10^{\frac{2f-34.3}{21}}$$

$$\left( \begin{array}{l} \log P_{(Torr)} = \frac{2}{21} f - \frac{79}{21} \\ \therefore P_{(Torr)} = 10^{\frac{2f-79}{21}} \end{array} \right)$$

The hatched region in FIG. 2 bordered by line A-B and line $P=133.3\times10^1$ Pa ($10^1$ Torr) indicates the reaction condition defined by the above-mentioned formula (II), according to the present invention.

The silicon epitaxial layers having excellent crystallographic properties produced in this reaction condition exhibit stacking faults of less than about $10/cm^2$ and have a more uniform thickness and fewer autodoped impurities than the epitaxial layers obtained by the prior art.

This embodiment of the process for producing silicon epitaxial layers of the present invention is carried out using a reaction gas mixture containing 0.1% by volume of dichlorosilane ($SiH_2Cl_2$) as the source gas and hydrogen ($H_2$) as the carrier gas. The source gas may be another compound such as monosilane ($SiH_4$) trichlorosilan ($SiHCl_3$) or tetrachlorosilane ($SiCl_4$), and the carrier gas may be another inert gas such as helium (He). Besides, the ratio of the source gas to the carrier gas may be modified within a range which is commonly used in the art. As for silicon epitaxial growth, the ratio of the source gas to the carrier gas is commonly in the range from 0.05 to 1.0% by volume. The relationship between the pressure P of the gas mixture and the frequency f of the high frequency power is maintained as defined by the above formula (II), whereas the ratio of the source gas to the carrier gas is kept as described above.

Figure 1:
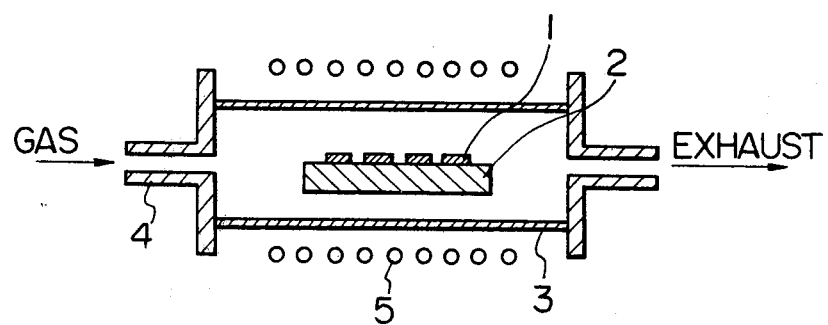
FIG. 1 is a sectional view of an apparatus used in a process for producing silicon epitaxial layers.
Figure 3A:
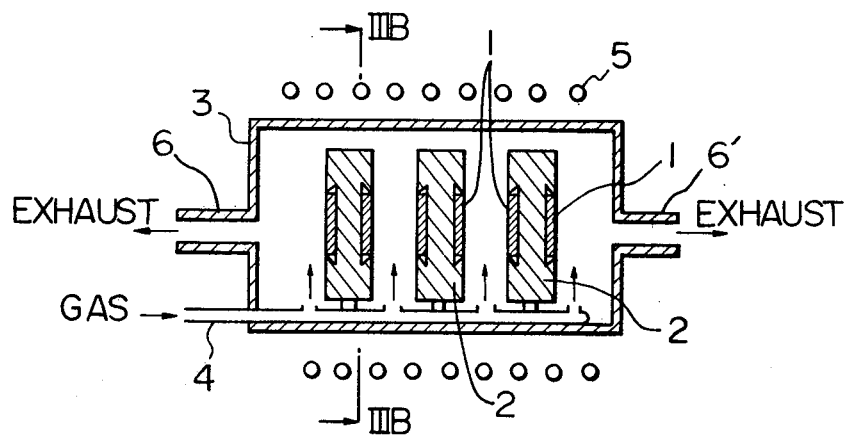
FIGS. 3 A and B are sectional views of another apparatus used in the process for producing silicon epitaxial layers of the present invention.
Figure 3B:
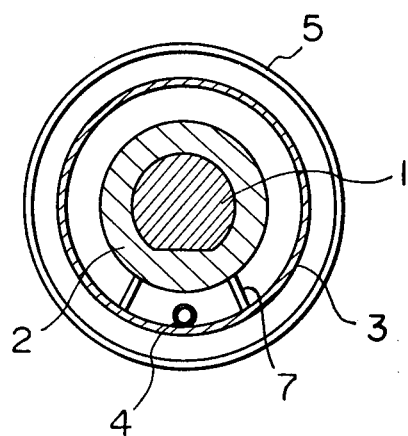

When a number of silicon semiconductor wafers are accomodated in one reaction vessel, it is advantageous that the gas mixture flows in separate streams along the surface of each silicon semiconductor wafer. FIGS. 3A and B illustrate a reaction vessel in which such separation of the gas mixture can be effected. Each of the silicon semiconductor wafers 1 is supported on a carbon susceptor 2, having its main surface substantially vertical to the longitudinal axis of the reaction tube 3. A gas inlet pipe 4 is inserted into the vessel 3 along its longitudinal axis and gas outlets are opened in the pipe 4 so that a separate stream flows along the main surface of each silicon semiconductor wafer. Thus, the resulting silicon epitaxial layers of each silicon semiconductor wafer exhibit more uniform thickness than those obtained in the reaction vessel illustrated in FIG. 1.

The reaction tube 3, as shown in FIGS. 3A and B, is, e.g., a quartz tube of 200 mm in diameter and 1000 mm in length. A work coil 5 of 10 mm diameter is wound around the reaction tube 3 over about 800 mm along the length thereof. Susceptors 2 of 120 mm diameter and 10 mm in thickness having recesses formed coaxially on both main surfaces thereof, which recesses accomodate semiconductor wafers 1 to be treated, are arranged by supporters 7 separately at a distance of about 20 mm from each other within the reaction tube 3. A gas inlet pipe 4 of 10 mm diameter inserted under the susceptors 2 within the reaction tube 3 has gas outlets along the length thereof between the susceptors. Also, one or two exhausts 6, 6' are provided at the ends of the reaction tube 3.

What we claim is:

1. An improvement in a process for producing an epitaxial layer comprising the steps of introducing a reaction gas mixture into a reaction vessel in which semiconductor substrates are located and heating said semiconductor substrates by high frequency induction power so that layers grow epitaxially on said semiconductor substrates, the improvement comprising
maintaining the frequency f of the high frequency power at not higher than 50 kHz, and maintaining the pressure P in said reaction vessel in the following range:

$$1333 > P(Pa) \geq 10^{\left(\frac{2f-34.3}{21}\right)}$$

$$\left( 10 > P(Torr) \geq 10^{\left(\frac{2f-79}{21}\right)} \right)$$

wherein P is the pressure, in respective units of Pa and Torr respectively in the reaction vessel, and f is the frequency in kHz of said high frequency power whereby said epitaxial layer has a density of stacking faults of less than 10/cm$^2$.

2. The process of claim 1, wherein the reaction gas mixture is a mixture of a silicon source gas and a carrier gas.

3. The process of claim 1 or 2, wherein said semiconductor substrate is made of silicon.

4. The process of claim 1 or 2, wherein said epitaxial layer is an epitaxial layer comprising silicon.

5. The process of claim 1 or 2, wherein said silicon source gas is selected from the group consisting of dichlorosilane, trichlorosilane, tetrachlorosilane, and monosilane.

6. The process of claim 2, wherein said carrier gas is selected from the group consisting of hydrogen and helium.

7. The process of claim 2 or 6 wherein the ratio of the silicon source gas to the carrier gas is in the range of 0.05 to 1.0% by volume.

8. The process of claim 1 or 2, comprising flowing a separate stream of said reaction gas mixture past the surface of each said substrate.

9. The process of claim 8, said reaction vessel having an axis of cylindrical symmetry, said method comprising mounting each said wafer at one face of a carbon susceptor, and aligning each said susceptor perpendicularly to the axis of the reaction vessel.

* * * * *

UNITED STATES PATENT AND TRADEMARK OFFICE
CERTIFICATE OF CORRECTION

PATENT NO. : 4,263,087
DATED : April 21, 1981
INVENTOR(S) : Kaoru Tanabe et al.

It is certified that error appears in the above—identified patent and that said Letters Patent is hereby corrected as shown below:

*Front page, [73] Assignee, "Tokyo" should be --Kawasaki--;
[57] Abstract, line 10, after "range" insert --:--.

*Column 1, line 4, "FIELD OF THE INVENTION" should be --BACKGROUND OF THE INVENTION--;
 *line 6, "Background of the Invention" should be --Field of the Invention--.
Column 2, line 57, after "vessel" change "is" to --may be--.
*Column 3, line 13, after "and" delete ",";
 line 16, "p" should be --P--;
 line 17, change "$10^{-1}$" to --$10^{-3}$--;
 *line 30, after "obtain" change "." to --:--;
 *line 68, "chlorosilan" should be --chlorosilane--.
*Column 4, lines 13 and 35, "accomodated" should be --accommodated--;
 line 60, "P(Pa)" should be --$P_{[Pa]}$--;
 line 68, after "power" insert --,--.
*Column 6, line 4, after "6" insert --,--.
Column 4, line 64, "P(Torr)" should be --$P_{(Torr)}$--.

Signed and Sealed this

Twenty-second Day of September 1981

[SEAL]

Attest:

GERALD J. MOSSINGHOFF

Attesting Officer    Commissioner of Patents and Trademarks